United States Patent
Matsuoka (10) Patent No.: US 12,547,069 B2
(45) Date of Patent: Feb. 10, 2026

(54) IMPRINT APPARATUS, IMPRINT METHOD AND ARTICLE MANUFACTURING METHOD

(71) Applicant: CANON KABUSHIKI KAISHA, Tokyo (JP)

(72) Inventor: Yoshihiro Matsuoka, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 226 days.

(21) Appl. No.: 18/160,799

(22) Filed: Jan. 27, 2023

(65) Prior Publication Data
US 2023/0259023 A1    Aug. 17, 2023

(30) Foreign Application Priority Data
Feb. 16, 2022    (JP) .................................. 2022-022305

(51) Int. Cl.
*G03F 7/00*    (2006.01)
*B29C 59/00*    (2006.01)
*B29C 59/02*    (2006.01)

(52) U.S. Cl.
CPC .......... *G03F 7/0002* (2013.01); *B29C 59/002* (2013.01); *B29C 59/022* (2013.01); *B29C 59/026* (2013.01); *B29C 2059/023* (2013.01)

(58) Field of Classification Search
CPC .................................................. G03F 7/0002
See application file for complete search history.

(56) References Cited

U.S. PATENT DOCUMENTS

| | | | |
|---|---|---|---|
| 9,921,469 B2 | 3/2018 | Sato | |
| 2011/0133354 A1* | 6/2011 | Kimura | G03F 7/0002 264/40.5 |
| 2012/0091611 A1* | 4/2012 | Yanagisawa | G03F 9/7042 425/135 |
| 2013/0015598 A1* | 1/2013 | Kimura | B82Y 10/00 425/150 |
| 2014/0191441 A1* | 7/2014 | Mori | G03F 7/0002 264/293 |
| 2014/0320842 A1* | 10/2014 | Sato | G03F 7/0002 355/77 |
| 2014/0367874 A1* | 12/2014 | Yamamoto | G03F 9/7003 264/293 |

(Continued)

FOREIGN PATENT DOCUMENTS

| | | |
|---|---|---|
| JP | 2014225637 A | 12/2014 |
| JP | 2016154207 A | 8/2016 |

(Continued)

*Primary Examiner* — Andrew D Graham
(74) *Attorney, Agent, or Firm* — ROSSI, KIMMS & McDOWELL LLP (57) ABSTRACT

An imprint apparatus including a control unit configured to obtains data for estimating a fluctuation of a positional shift between a mold and a substrate occurring during a contact step, and when performing an imprint process on the substrate, obtains an estimation value by estimating the positional shift occurring during the contact step from the positional shift measured by a measurement unit at a reference time during the contact step and the data, and drives at least one of the mold and the substrate in the contact step based on the estimation value so as to reduce the positional shift at a start of an alignment step.

12 Claims, 9 Drawing Sheets

(56) References Cited

U.S. PATENT DOCUMENTS

| | | | | |
|---|---|---|---|---|
| 2015/0001749 A1* | 1/2015 | Arai | ............... | B82Y 10/00 |
| | | | | 425/141 |
| 2015/0042012 A1* | 2/2015 | Nakagawa | ............ | B82Y 40/00 |
| | | | | 264/293 |
| 2015/0290871 A1* | 10/2015 | Okada | ............... | G03F 7/0002 |
| | | | | 264/40.7 |
| 2016/0052179 A1* | 2/2016 | Murayama | ............ | G03F 7/0002 |
| | | | | 264/40.5 |
| 2016/0077451 A1* | 3/2016 | Nakagawa | ............ | G03F 7/0002 |
| | | | | 425/150 |
| 2016/0096313 A1* | 4/2016 | Usui | ............... | G03F 7/0002 |
| | | | | 425/150 |
| 2016/0136872 A1* | 5/2016 | Yanagisawa | ......... | G03F 7/0002 |
| | | | | 425/150 |
| 2016/0231648 A1* | 8/2016 | Hirano | ............... | G03F 7/00 |
| 2016/0257060 A1* | 9/2016 | Ito | ............... | G03F 7/0002 |
| 2016/0288403 A1* | 10/2016 | Schumaker | ............ | G03F 7/0002 |
| 2016/0297136 A1* | 10/2016 | Wakabayashi | ......... | B29C 64/00 |
| 2016/0320697 A1* | 11/2016 | Asano | ............... | G03F 7/161 |
| 2017/0057153 A1* | 3/2017 | Tanaka | ............... | G03F 7/0002 |
| 2017/0274418 A1* | 9/2017 | Shiode | ............... | B05D 3/007 |
| 2017/0329237 A1* | 11/2017 | Suzuki | ............... | G03F 7/70775 |
| 2019/0011844 A1* | 1/2019 | Kimura | ............... | G03F 9/7042 |
| 2019/0212645 A1* | 7/2019 | Kusaka | ............... | G03F 7/0002 |
| 2020/0004139 A1* | 1/2020 | Sato | ............... | G03F 7/0002 |
| 2020/0379362 A1* | 12/2020 | Nishimura | ............ | G03F 9/7088 |

FOREIGN PATENT DOCUMENTS

| | | |
|---|---|---|
| JP | 2019024089 A | 2/2019 |
| KR | 1020140127173 A | 11/2014 |

\* cited by examiner

IMPRINT APPARATUS, IMPRINT METHOD AND ARTICLE MANUFACTURING METHOD

BACKGROUND OF THE INVENTION

Field of the Invention

The present invention relates to an imprint apparatus, an imprint method and an article manufacturing method.

Description of the Related Art

As a technique of manufacturing an article such as a semiconductor element or a Micro Electro Mechanical System (MEMS), there is known an imprint technique of molding an imprint material on a substrate using a mold. The imprint technique can form a pattern of the imprint material on the substrate by curing the imprint material in a state in which the imprint material supplied onto the substrate and the mold are in contact with each other, and separating the mold from the cured imprint material on the substrate.

In an imprint apparatus that employs the imprint technique as described above, upon bringing the imprint material on the substrate and the mold into contact with each other, the mold is deformed into a convex shape toward the substrate side so as to prevent bubbles from remaining between the imprint material and the mold. In addition, the imprint apparatus is required to transfer a pattern on the mold to a shot region on the substrate with high accuracy. Therefore, in general, the imprint apparatus employs a method of aligning the mold and the shot region on the substrate after the imprint material on the substrate and the mold are brought into contact with each other. Each of Japanese Patent Laid-Open Nos. 2014-225637 and 2016-154207 proposes a technique concerning the alignment.

Japanese Patent Laid-Open No. 2014-225637 discloses a technique of correcting the influence, on the alignment, of deformation of the mold caused by the contact (contact step) between the imprint material on the substrate and the mold, thereby enabling the alignment between the mold and the shot region in parallel with the contact step. Japanese Patent Laid-Open No. 2016-154207 discloses a technique of correcting, using the coordinates of the shot region on the substrate, the influence of a pressing force upon bringing the imprint material on the substrate and the mold into contact with each other, thereby reducing the positional shift between the mold and the shot region caused by the contact.

However, with an increasing demand for improvement of the productivity of the imprint apparatus, time constraints on the alignment are becoming more severe. To shorten the time required for the alignment, it is effective to reduce the positional shift amount between the mold and the shot region at the start time of the alignment.

The techniques disclosed in Japanese Patent Laid-Open Nos. 2014-225637 and 2016-154207 are effective for reducing the positional shift amount between the mold and the shot region at the time of contact between the imprint material on the substrate and the mold. However, the positional shift amount between the mold and the shot region fluctuates due to complex actions of the underlying portion (step) formed on the substrate, the edge structure in the outer peripheral portion of the substrate, the viscosity generated between the mold and the substrate via the imprint material, and the like. Accordingly, the positional shift amount between the mold and the shot region at the start time of the alignment cannot be sufficiently reduced, and a considerable time is required for the alignment.

SUMMARY OF THE INVENTION

The present invention provides a technique advantageous in alignment between a mold and a substrate.

According to one aspect of the present invention, there is provided an imprint apparatus for performing an imprint process of forming a pattern of an imprint material on a substrate using a mold, the apparatus including a measurement unit configured to measure a positional shift between the mold and the substrate, and a control unit, wherein the imprint process includes a contact step of, before an alignment step of aligning the mold and the substrate, bringing the mold into contact with the imprint material on the substrate while deforming the mold into a convex shape toward a side of the substrate, and planarizing the mold in a state in which the mold and the imprint material are in contact with each other, and the control unit obtains data for estimating a fluctuation of a positional shift between the mold and the substrate occurring during the contact step, and when performing the imprint process on the substrate, obtains an estimation value by estimating the positional shift occurring during the contact step from the positional shift measured by the measurement unit at a reference time during the contact step and the data, and drives at least one of the mold and the substrate in the contact step based on the estimation value so as to reduce the positional shift at a start of the alignment step.

Further aspects of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 1:
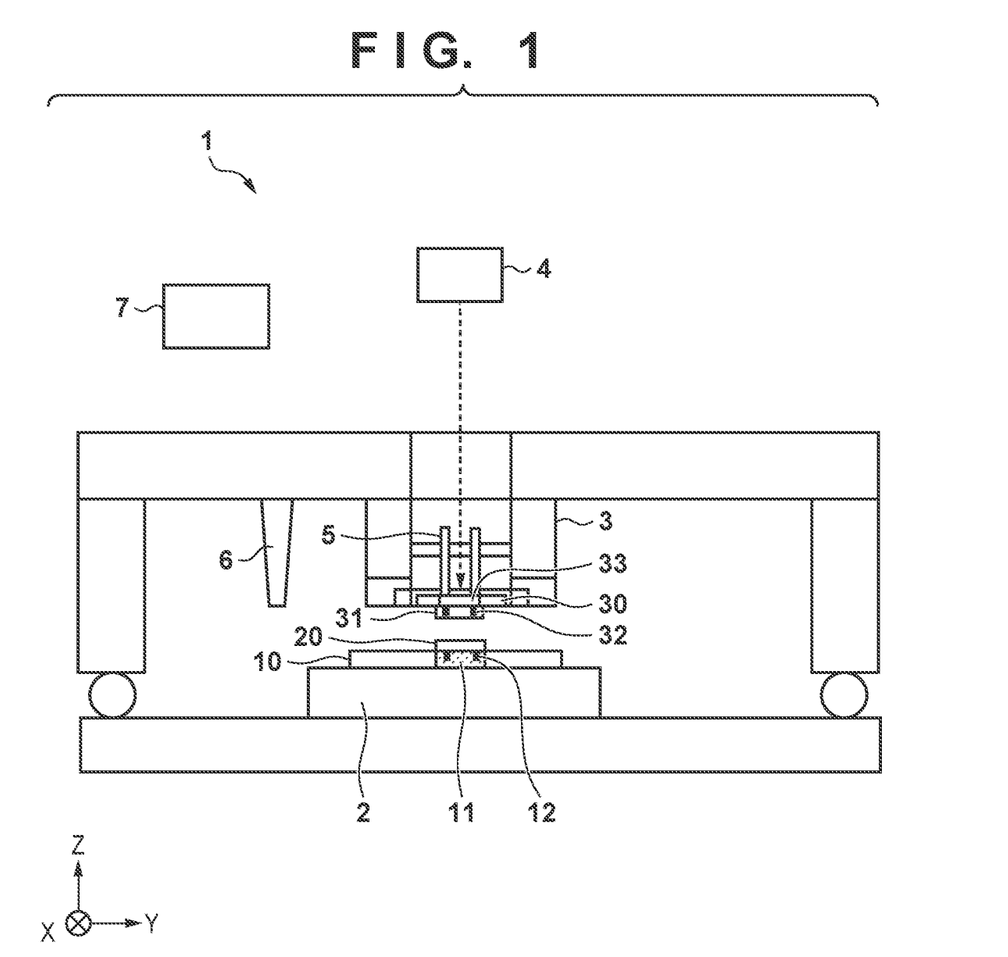
FIG. 1 is a schematic view illustrating configurations of an imprint apparatus according to an aspect of the present invention.

FIG. 1 is a schematic view illustrating configurations of an imprint apparatus 1 according to an aspect of the present invention. The imprint apparatus 1 is a lithography apparatus employed in a lithography step that is a manufacturing step for a device such as a semiconductor element, a liquid crystal display element, or magnetic storage medium as an article to form a pattern on a substrate. The imprint apparatus 1 performs an imprint process for forming a pattern of an imprint material on a substrate using a mold. More specifically, the imprint apparatus 1 brings an uncured imprint material supplied (arranged) on the substrate into contact with the mold, and applies curing energy to the imprint material, thereby forming a pattern of a cured product to which the pattern of the mold is transferred.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa's (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

In the specification and the accompanying drawings, directions will be indicated on an XYZ coordinate system in which directions parallel to the surface of a substrate are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are OX, OY, and OZ, respectively.

In this embodiment, the imprint apparatus 1 employs a photo-curing method as the curing method of the imprint material. As shown in FIG. 1, the imprint apparatus 1 includes a substrate driving unit 2, a mold driving unit 3, an irradiation unit 4, a measurement unit 5, a supply unit 6, and a control unit 7.

The substrate driving unit 2 has a function of holding and driving a substrate 10. The substrate driving unit 2 includes a substrate chuck, a substrate stage, and the like. In this embodiment, the substrate driving unit 2 is driven in at least the X and Y directions while holding the substrate 10. During alignment between a mold 30 and the substrate 10, the substrate driving unit 2 is driven in accordance with a command value output from the control unit 7 based on the measurement result of the measurement unit 5.

The mold driving unit 3 has a function of holding and driving the mold 30. The mold driving unit 3 includes a mold chuck, an imprint head, and the like. In this embodiment, the mold driving unit 3 is driven in at least the Z direction while holding the mold 30. The mold driving unit 3 is used for an operation of bringing (pressing) a pattern region 31 (pattern) of the mold 30 into contact with an imprint material 20 on the substrate and an operation of separating the mold 30 from the cured imprint material 20 on the substrate. An engraved concave portion 33 (cavity) is formed in the opposite surface of the surface including the pattern region 31 of the mold 30. When a pressure adjustment unit applies a pressure to the concave portion 33 formed in the mold 30 via the mold driving unit 3, the mold 30 (pattern region 31 thereof) held by the mold driving unit 3 can be deformed into a convex shape toward the substrate 10 side.

The substrate driving unit 2 and the mold driving unit 3 form a driving unit that relatively drives the substrate 10 and the mold 30. This driving unit can adjust the relative position and relative posture between the substrate 10 and the mold 30 by driving at least one of the substrate 10 and the mold 30.

In the imprint process, the irradiation unit 4 irradiates the imprint material 20 on the substrate with light that cures the imprint material 20. The irradiation unit 4 includes, for example, a light source and a plurality of optical members that adjust the light emitted from the light source to a state appropriate for the imprint process.

The measurement unit 5 simultaneously or separately detects a mark 12 provided on the substrate 10 (a shot region 11 thereof) and a mark 32 provided on the mold 30, thereby measuring the relative position between the substrate 10 and the mold 30, that is, the positional shift between the substrate 10 and the mold 30.

The supply unit 6 has a function of supplying (arranging) the imprint material 20 onto the substrate 10. The supply unit 6 includes, for example, a dispenser that discharges the imprint material 20 onto each shot region on the substrate. For a plurality of shot regions on the substrate, the supply unit 6 may individually supply the imprint material 20 onto each shot region, or may collectively supply the imprint material 20 onto some shot regions. Alternatively, the imprint apparatus 1 may not include the supply unit 6, but the substrate 10 onto which the imprint material 20 has been supplied by an apparatus (spin coater or the like) different from the imprint apparatus 1 may be loaded to the imprint apparatus 1.

The control unit 7 is formed from an information processing apparatus (computer) including a CPU, a memory, and the like, and operates the imprint apparatus 1 by comprehensively controlling the respective units of the imprint apparatus 1 in accordance with a program stored in a storage unit. The control unit 7 may be formed integrally with the imprint apparatus 1 (in a common housing), or may be formed separately from the imprint apparatus 1 (in another housing).

In this embodiment, the control unit 7 controls the imprint process and processes concerning the imprint process. For example, in the imprint process, the control unit 7 controls alignment between the mold 30 and the substrate 10. More specifically, based on the measurement result of the measurement unit 5, the control unit 7 drives at least one of the substrate 10 and the mold 30 such that the positional shift between the substrate 10 (shot region 11 thereof) and the mold 30 reaches a target value (falls within an allowable range).

Figure 2:
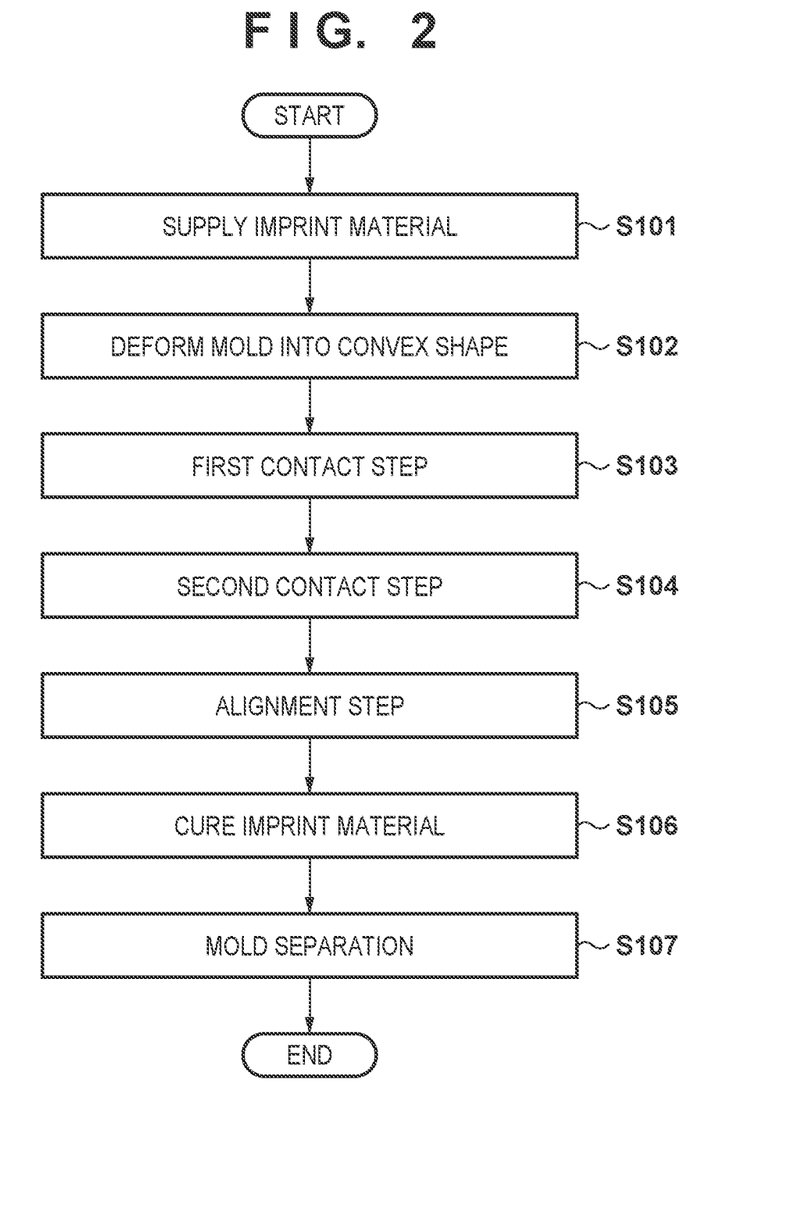
FIG. 2 is a flowchart for describing a general imprint process.
Figure 3:
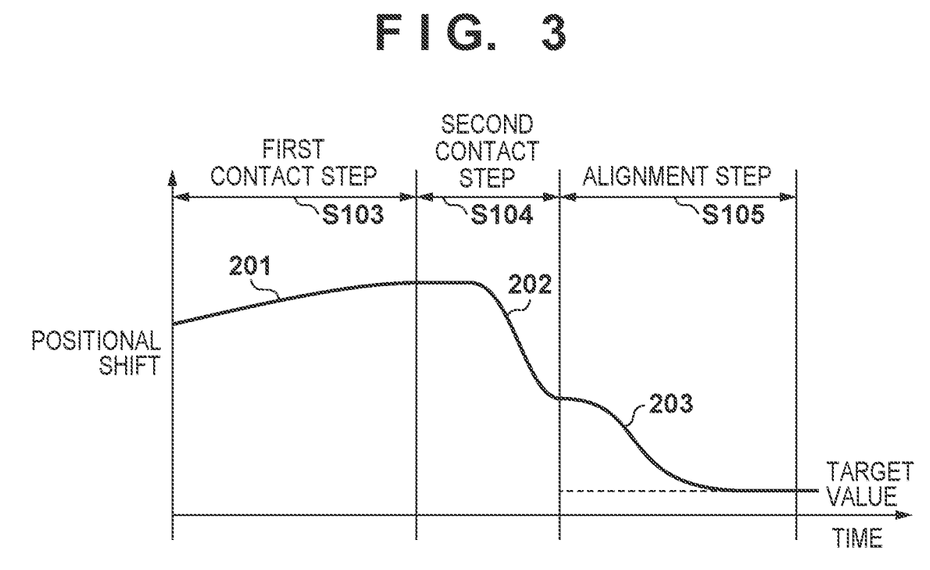
FIG. 3 is a graph showing the fluctuation (temporal change) of the positional shift between a shot region on a substrate and a mold.

With reference to FIGS. 2 and 3, a general imprint process in the imprint apparatus 1 will be described while giving attention to the positional shift between the shot region 11 on the substrate and the mold 30. FIG. 2 is a flowchart for descripting the general imprint process. FIG. 3 is a graph showing the fluctuation (temporal change) of the positional shift between the shot region 11 on the substrate and the mold 30 in the general imprint process. Note that respective steps (start time, end time, and the like) included in the imprint process can be specified (defined) from, for example, various pieces of information described in the imprint recipe.

In step S101, the imprint material 20 is supplied from the supply unit 6 onto the shot region 11 (the target shot region on which the imprint process is to be performed) on the substrate. Note that if the imprint material 20 has been collectively supplied onto the plurality of shot regions including the target shot region on the substrate, this step (S101) is unnecessary. Also, if the imprint material 20 has been supplied onto the target shot region on the substrate by an apparatus different from the imprint apparatus 1, this step (S101) is unnecessary.

In step S102, the pressure adjustment unit applies a pressure to the concave portion 33 of the mold 30 to deform the mold 30 (pattern region 31 thereof) held by the mold driving unit 3 into a convex shape toward the substrate 10 side. By deforming the mold 30 into the convex shape toward the substrate 10 side, the fillability of the imprint material 20 into the pattern region 31 of the mold 30 can be improved upon bringing the imprint material 20 on the substrate and the mold 30 into contact with each other.

In step S103, the mold driving unit 3 is lowered, that is, driven downward along the Z direction, thereby bringing the imprint material 20 on the substrate and the mold 30 into contact with each other in a state in which the mold 30 is deformed into the convex shape toward the substrate 10 side. Step S103 is a first contact step of bringing the mold 30 into contact with the imprint material 20 on the substrate while deforming the mold 30 into the convex shape toward the substrate 10 side. In the first contact step, as shown in FIG. 3, a positional shift 201 (positional shift amount) between the shot region 11 on the substrate and the mold 30 moderately fluctuates due to the influences of a change of the shape of the mold 30 and the force of pressing the mold 30 against the imprint material 20.

In step S104, the pressure adjustment unit stops applying the pressure to the concave portion 33 of the mold 30 to return the convex shape of the mold 30 held by the mold driving unit 3 to the original shape (flat state). Step S104 is a second contact step of planarizing the mold 30 in a state in which the mold 30 and the imprint material 20 are in contact with each other. Also in the second contact step, as shown in FIG. 3, a positional shift 202 (positional shift amount) between the shot region 11 on the substrate and the mold 30 fluctuates due to the influences of a change of the pressure in the concave portion 33 of the mold 30 and the force of pressing the mold 30 against the imprint material 20.

In step S105, the positional shift between the shot region 11 on the substrate and the mold 30 is made to reach the target value by driving the substrate 10 via the substrate driving unit 2 while measuring the positional shift by the measurement unit 5. Step S105 is an alignment step of aligning the substrate 10 and the mold 30. In the alignment step, as shown in FIG. 3, a positional shift 203 (positional shift amount) between the shot region 11 on the substrate and the mold 30 is made to reach the target value. In the alignment step, in accordance with the magnitude of the positional shift at the start time of starting the alignment step, the driving amount of the substrate driving unit 2 (substrate 10) required to align the substrate 10 and the mold 30 increases or decreases, and the time required for the alignment step also increases or decreases.

In step S106, in the state in which the imprint material 20 on the substrate and the mold 30 are in contact with each other, the irradiation unit 4 irradiates the imprint material 20 with light to cure the imprint material 20.

In step S107, the mold driving unit 3 is lifted, that is, driven upward along the Z direction, thereby separating the mold 30 from the cured imprint material 20 on the substrate (mold separation). Thus, a pattern of the cured imprint material 20 is formed on the shot region 11 on the substrate.

In the practical manufacture of a semiconductor, a plurality of shot regions are generally arrayed on a substrate. Therefore, steps S101 to S107 are repeated until the pattern of the cured imprint material 20 is formed on each shot regions.

FIG. 3 shows the ideal measurement results of the measurement unit 5. However, in the first contact step, since the imprint material 20 on the substrate and the mold 30 are not completely in contact (tight contact) with each other, there can be a case in which the marks 12 and 32 cannot be detected and the measurement result of the measurement unit 5 becomes unstable.

Figure 4A:
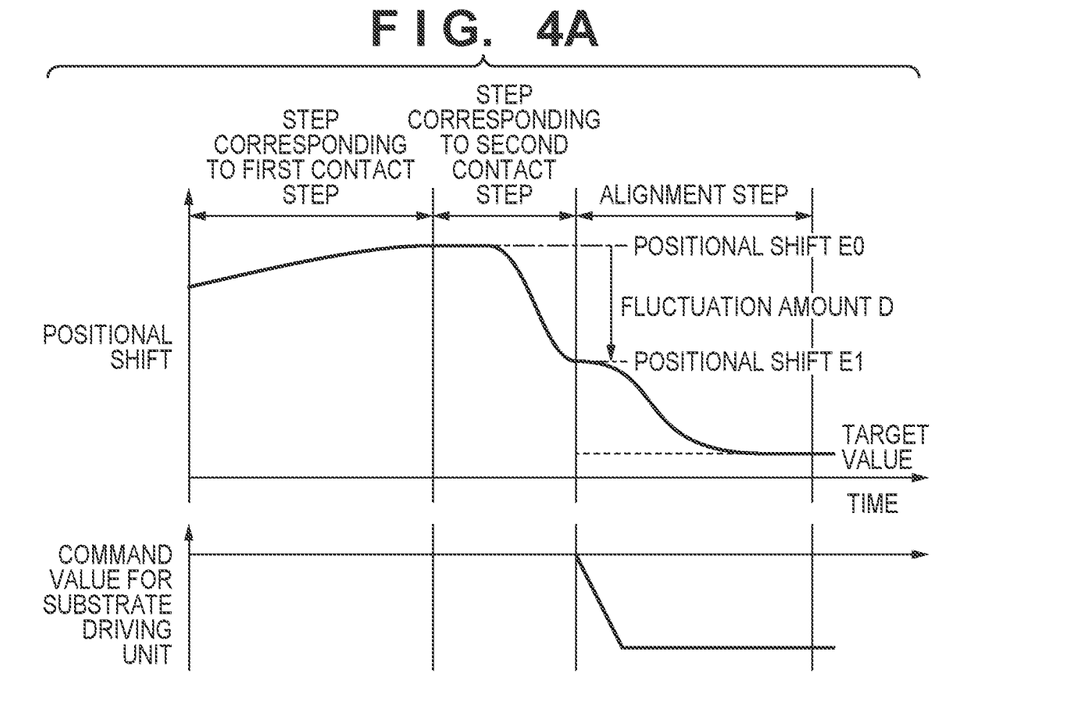
FIGS. 4A and 4B are graphs for describing an imprint process according to an embodiment.
Figure 4B:
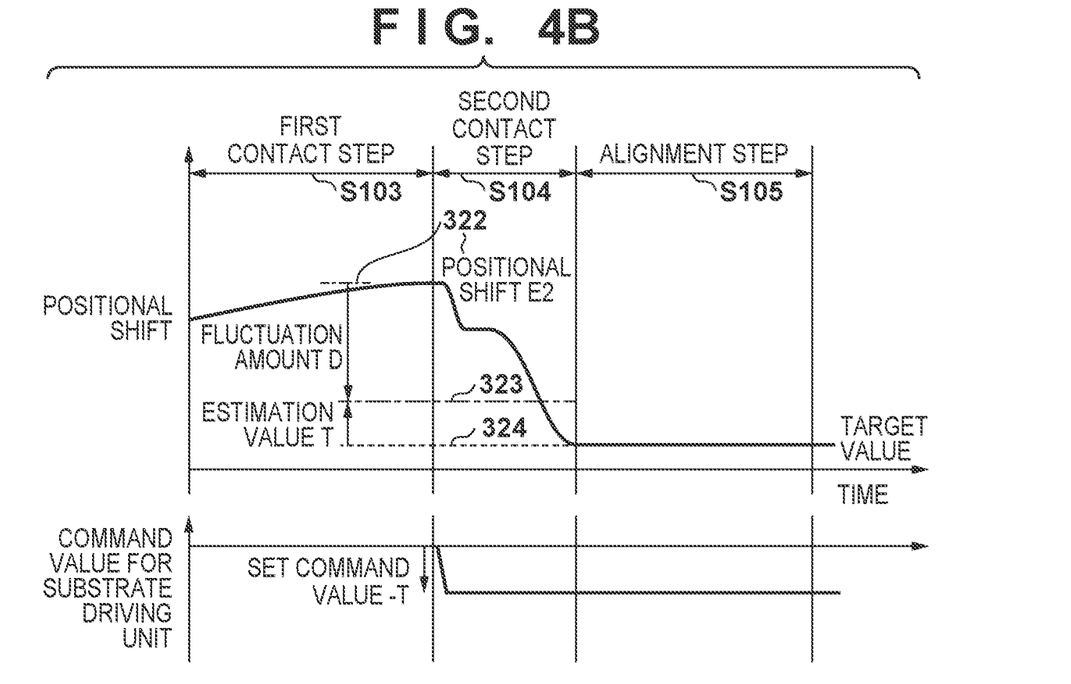

With reference to FIGS. 4A and 4B, an imprint process (imprint method) according to this embodiment will be described. In this embodiment, first, data for estimating the fluctuation of the positional shift between the mold 30 and the substrate 10 occurring during the contact step is acquired. Here, the contact step is a step of bringing the mold 30 into contact with the imprint material 20 on the substrate while deforming the mold 30 into a convex shape toward the substrate 10 side, and planarizing the mold 30 in a state in which the mold 30 and the imprint material 20 are in contact with each other. Accordingly, the contact step includes the first contact step (S103) and the second contact step (S104). In this embodiment, data for estimating the fluctuation of the positional shift between the mold 30 and the substrate 10 occurring during the second contact step is particularly acquired.

More specifically, before performing the imprint process on the substrate 10, a preprocess similar to the imprint process is performed on a test substrate. Then, as shown in FIG. 4A, from the result of performing the preprocess on the test substrate, a positional shift E0 between the mold 30 and the test substrate at the start time of starting a step corresponding to the second contact step is acquired. In addition, a positional shift E1 between the mold 30 and the test substrate at the start time of starting the alignment step, that is, the end time of ending the step corresponding to the second contact step is acquired. Then, as data for estimating the fluctuation of the positional shift between the mold 30 and the substrate 10 occurring during the second contact step, the difference between the positional shift E0 and the positional shift E1, that is, a positional shift fluctuation amount D=E1−E0 is acquired. Note that, in this embodiment, it is only necessary to acquire the fluctuation amount D of the positional shift occurring during the second contact step. Therefore, for example, the alignment step after the contact step (first contact step and second contact step) need not be performed. In other words, the preprocess only needs to include at least the step of bringing the mold 30 into contact with the imprint material on the test substrate while deforming the mold 30 into the convex shape toward the test substrate side and planarizing the mold 30 in the state in which the mold 30 and the imprint material are in contact with each other.

Note that in this embodiment, the fluctuation amount D of the positional shift is acquired by performing the preprocess on the test substrate. Therefore, it is preferable to use, as the test substrate, a substrate including the same underlying structure as the substrate 10, that is, a substrate including a plurality of shot regions arrayed in the same layout as the plurality of shot regions on the substrate 10. With this, the fluctuation amount D equivalent to the fluctuation amount in the case of actually performing the imprint process on the substrate 10 can be acquired.

Figure 5:
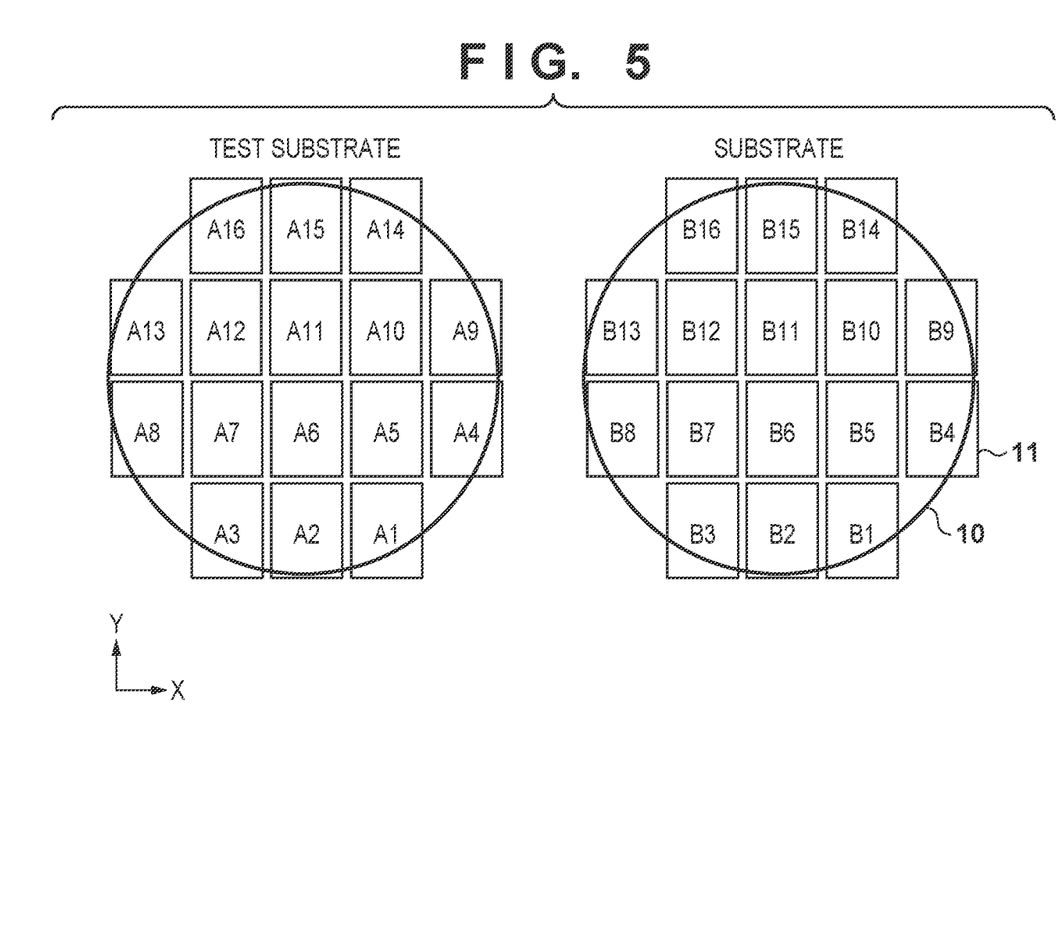
FIG. 5 is a view showing the array of shot regions on a test substrate and the array of shot regions on a substrate.

If the fluctuation amount D changes due to the underlying structure in each shot region on the substrate, it is necessary to perform the preprocess on each shot region on the test substrate, and acquire a fluctuation amount Di for each shot region i from the result thereof. More specifically, as shown in FIG. 5, the preprocess is performed on each of shot regions A1 to A16 on the test substrate, and a fluctuation amount D1 to be used in the imprint process on a shot region B1 on the substrate 10 is acquired from the result of the preprocess on the shot region A1. Similarly, fluctuation amounts D2 to D16 to be used in the imprint processes on shot regions B2 to B16 on the substrate 10 are acquired from the results of the preprocesses on the shot regions A2 to A16 on the test substrate, respectively.

Once the fluctuation amount D of the positional shift occurring during the second contact step is acquired as the data for estimating the fluctuation of the positional shift between the mold 30 and the substrate 10 occurring during the second contact step, the imprint process is performed on the substrate 10. In this embodiment, an estimation value is obtained by estimating the positional shift between the mold 30 and the substrate 10 occurring during the contact step from the positional shift between the mold 30 and the substrate 10 measured by the measurement unit 5 at a reference time during the contact step and the fluctuation amount D of the positional shift acquired in advance. Then, based on the estimation value, at least one of the mold 30 and the substrate 10 is driven in the contact step so as to reduce the positional shift between the mold 30 and the substrate 10 at the start time (at the start) of starting the alignment step.

More specifically, as shown in FIG. 4B, from the fluctuation amount D acquired in advance and a positional shift E2 between the mold 30 and the substrate 10 at the start time of starting the second contact step (reference time), the positional shift at the start of the alignment step is estimated, thereby obtaining an estimation value T=E2+D. The estimation value T represents the positional shift between the mold 30 and the substrate 10 occurring during the contact step, and also represents the positional shift at the end time of ending the second contact step. Then, as shown in FIG. 4B, a command value for driving the substrate driving unit 2 is output while reflecting the estimation value T thereon. With this, the alignment between the mold 30 and the substrate 10 can be performed in parallel with the second contact step. For example, in order to make the positional shift at the start of the alignment step close to the target value, a command value (set command value−T) obtained by subtracting the estimation value T from a set command value given to the substrate driving unit 2 by default is output during the second contact step so as to cancel the estimation value T.

When the substrate driving unit 2 is driven in accordance with the command value, as shown in FIG. 4B, a positional shift 322 between the mold 30 and the substrate 10 fluctuates, and a positional shift 323 occurs in the second contact step. Note that in FIG. 4B, for the sake of easy understanding of the positional shift 322 and the positional shift 323 (fluctuations thereof), timings of the positional shifts 322 and 323 are shown while being shifted from each other. However, in practice, the positional shift 322 and the positional shift 323 occur in parallel. Note that the total fluctuation amounts of the positional shift 322 and the positional shift 323 will be the same.

As has been described above, according to this embodiment, it is possible to reduce the positional shift between the mold 30 and the substrate 10 at the start of the alignment step to make it close to the target value. Accordingly, the time required for the alignment between the mold 30 and the substrate 10 can be shortened.

In the manufacture of a semiconductor, in general, a plurality of substrates are manufactured as one unit (lot). Therefore, the first substrate of the plurality of substrates included in the lot may be used as the test substrate, and the fluctuation amount of the positional shift serving as the data for estimating the fluctuation of the positional shift between the mold 30 and the substrate 10 occurring during the contact step may be acquired for each shot region. With this, in the imprint processes for the second and subsequent substrates included in the same lot, the time required for the alignment can be shortened. For the first substrate of the lot, since the data for estimating the fluctuation of the positional shift between the mold 30 and the substrate 10 occurring during the contact step cannot be acquired, the alignment accuracy may be maintained by extending the time of the alignment step, as needed.

Figure 6:
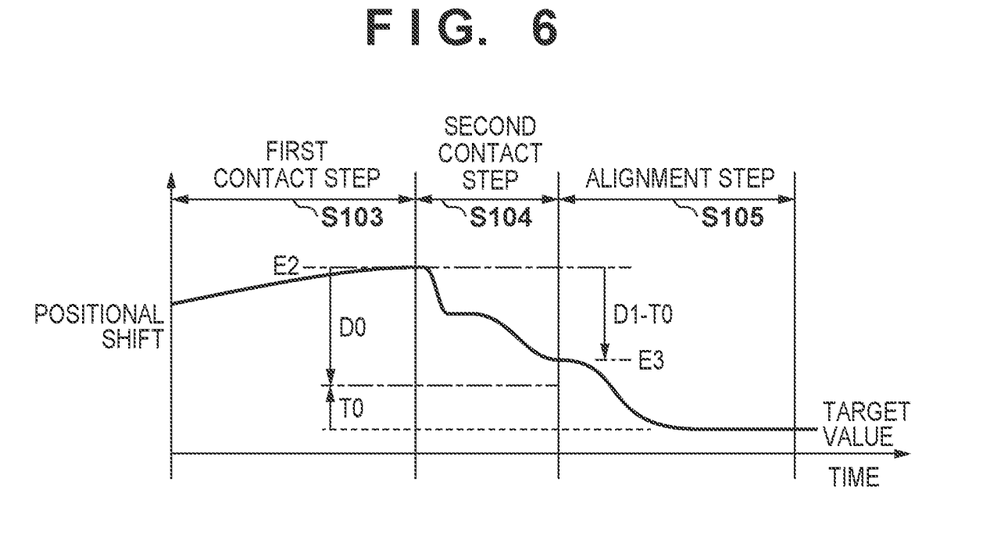
FIG. 6 is a graph for describing the imprint process according to the embodiment.

The data for estimating the fluctuation of the positional shift between the mold 30 and the substrate 10 occurring during the contact step may be updated based on the result of performing the imprint process on the substrate 10 (each shot region thereon). For example, as shown in FIG. 6, from a fluctuation amount D0 of the positional shift acquired in advance and the positional shift E2 at the start of the second contact step, an estimation value T0=E2+D0 at the start of the alignment step is obtained. Then, based on the estimation value, the substrate driving unit 2 is driven in the second contact step so as to reduce the positional shift at the start of the alignment step. Here, let E3 be the positional shift at the start of the alignment step, and D1 be the actual fluctuation amount of the positional shift. If the fluctuation amount D0 and the fluctuation amount D1 are equal to each other, the positional shift E3 matches the target value. However, if the fluctuation amount D0 and the fluctuation amount D1 do not match for some reason, the positional shift E3 is expressed by E3=E2+D1−T0=D1−D0. Accordingly, a positional shift occurs at the start of the alignment step. In this case, the fluctuation amount D1=D0+E3 is acquired as data for estimating the fluctuation of the positional shift between the mold 30 and the substrate 10 occurring during the contact step, and the data is used in the next imprint process.

For the update of the fluctuation amount of the positional shift serving as the data for estimating the fluctuation of the positional shift between the mold 30 and the substrate 10 occurring during the contact step, a threshold value may be set on the positional shift E3 at the start of the alignment step. Only if the positional shift E3 at the start of the alignment step is equal to or larger than the threshold value, the fluctuation amount of the positional shift is updated. Note that if the positional shift E3 at the start of the alignment step is equal to or larger than the threshold value (that is, if the positional shift E3 is large), it is conceivable that the alignment step requires time. In this case, the alignment accuracy may be maintained by extending the time of the alignment step.

Shot regions in the vicinity of each other have similar tendencies of the fluctuation of the positional shift between the mold 30 and the substrate 10 occurring during the contact step. Therefore, among the shot regions on the substrate, for a target shot region to undergo the imprint process, the fluctuation amount of the positional shift may be acquired from the result of the shot region having undergone the imprint process. More specifically, as shown in FIG. 5, when sequentially performing the imprint process on the shot regions B1 to B16 on the substrate 10, first, the fluctuation amount of the positional shift is acquired from the result of the imprint process on the shot region B1. This fluctuation amount of the positional shift may be used when performing the imprint process on the shot regions B2 and B4.

Figure 7:
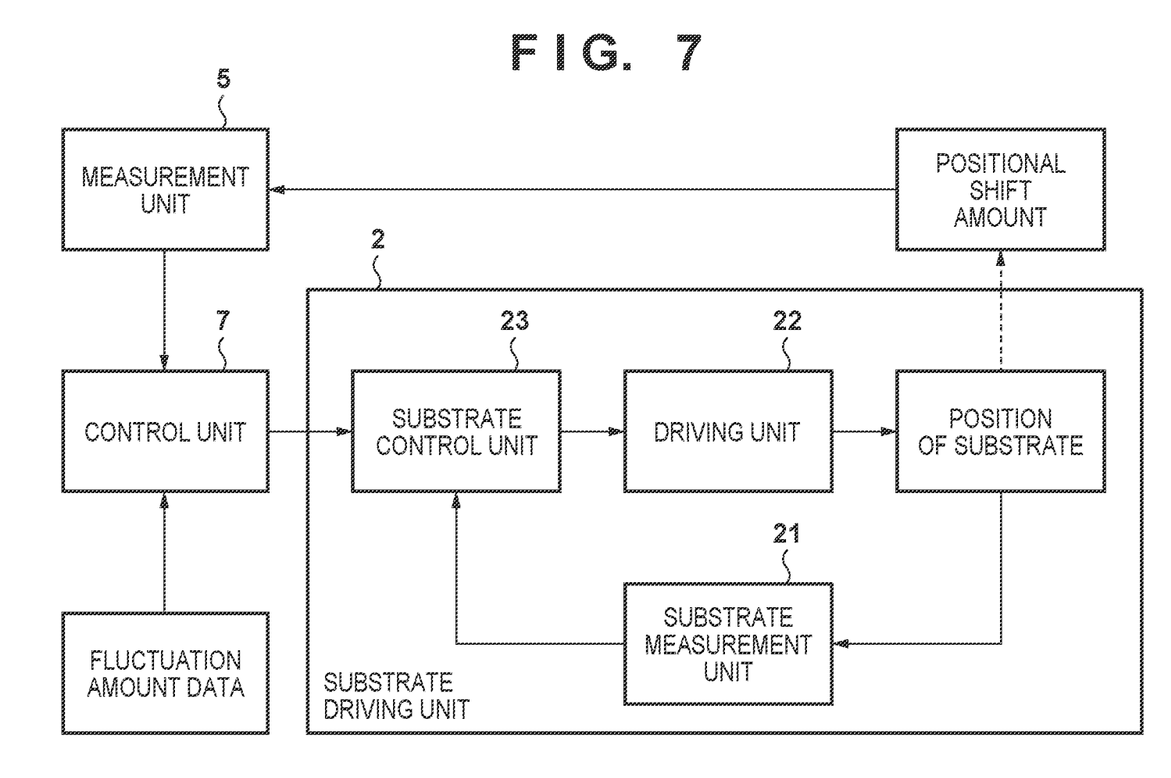
FIG. 7 is a block diagram showing an example of configurations of a substrate driving unit.

A case has been described above in which only the data (fluctuation amount data) for estimating the fluctuation of the positional shift between the mold 30 and the substrate 10 occurring during the second contact step is used upon giving the command value to the substrate driving unit 2 in the second contact step of the imprint process on the substrate 10. As shown in FIG. 7, the substrate driving unit 2 may include a substrate measurement unit 21, a driving unit 22, and a substrate control unit 23. The substrate measurement unit 21 includes an interferometer or encoder for measuring the position of the substrate 10. The driving unit 22 includes a linear motor or the like for changing the position of the substrate 10. The substrate control unit 23 controls the driving unit 22 based on the position of the substrate 10 measured by the substrate measurement unit 21 and the command value from the control unit 7 (the driving target position of the substrate 10). In this case, when giving the command value considering the estimation value T from the control unit 7 to the substrate driving unit 2, if the target value is instantaneously significantly changed, due to the control characteristics of the substrate driving unit 2, excessive driving or oscillation may occur. Therefore, the command value that continuously changes (at respective times in the second contact step) may be given to the substrate driving unit 2 as the command value such that it reaches the estimation value T during the second contact step.

Consider a case of acquiring, as the data for estimating the fluctuation of the positional shift between the mold 30 and the substrate 10 occurring during the second contact step, time-series data indicating, in time series, the positional shifts between the mold 30 and the test substrate at respective times during a step corresponding the second contact step. In this case, the positional shift at each time during the second contact step is estimated from the positional shift measured by the measurement unit 5 at the start time of the second contact step and the time-series data. Then, the command value that continuously changes (at respective times in the second contact step) may be given to the substrate driving unit 2 so as to reduce the positional shifts (estimation values) at the respective times during the second contact step.

The measurement target of the substrate measurement unit 21 is the position of the substrate 10, but the final control target in this embodiment is the relative position between the substrate 10 and the mold 30. Hence, if the position of the mold 30 changes due to the influence of driving of the substrate driving unit 2, the driving amount (change amount) of the position of the substrate 10 does not necessarily match the fluctuation amount of the positional shift. Therefore, the measurement unit 5 sequentially measures the positional shift between the mold 30 and the substrate 10, and the fluctuation of the positional shift between the mold 30 and the substrate 10 occurring during the contact step is also sequentially updated. With this operation, the positional shift at the start of the alignment step can be minimized.

Figure 8:
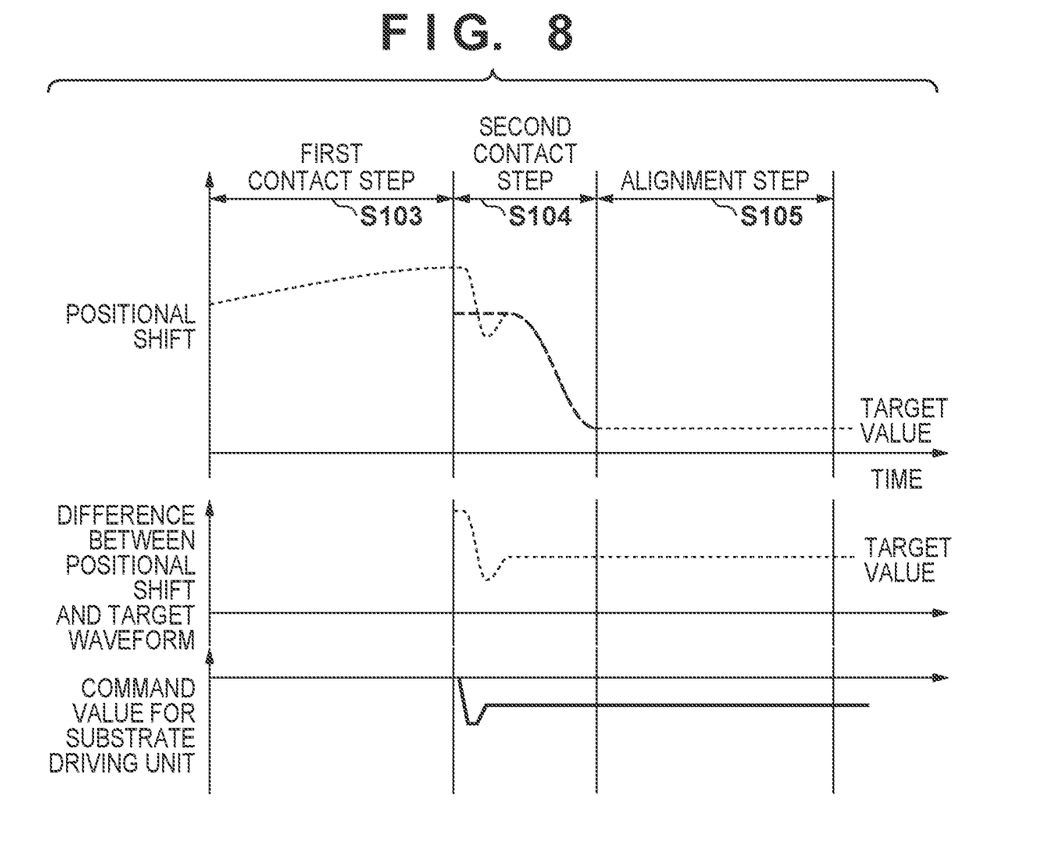
FIG. 8 is a graph for describing the imprint process according to the embodiment.

For example, as shown in FIG. 8, the fluctuation of the positional shift between the mold 30 and the substrate 10 acquired by sequentially measuring it by the measurement unit 5 during the second contact step is represented by a fluctuating waveform, and a target waveform during the second contact step is generated from the fluctuating waveform and the target value. Then, during the second contact step, the command value is given from the control unit 7 to the substrate driving unit 2 in accordance with the difference between the target waveform and the positional shift measured by the measurement unit 5. With this, the positional shift at the start of the alignment step can be reduced to be minimized.

In this embodiment, the positional shift between the mold 30 and the substrate 10 is acquired from the measurement result of the measurement unit 5. However, since the measurement unit 5 detects the mark 12 provided in the shot region 11 on the substrate via the imprint material 20, the measurement by the measurement unit 5 becomes unstable in the contact step due to the influence of filling of the imprint material 20 or the like. In the contact step, if the measurement unit 5 cannot detect the mark 12 so a normal measurement result cannot be obtained, a certain period may be set for the measurement timing, and the positional shift (fluctuation thereof) between the mold 30 and the substrate 10 may be acquired from a normal measurement result obtained in this period. It is also possible to acquire the positional shift between the mold 30 and the substrate 10 by averaging measurement results obtained in the certain period.

The pattern of a cured product formed using the imprint apparatus 1 (imprint method) in this embodiment is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and an MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 9A:
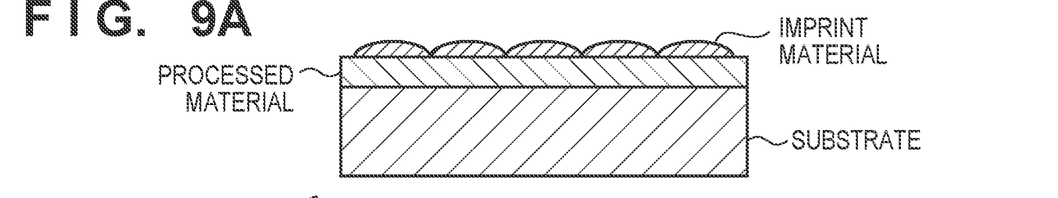
FIGS. 9A to 9F are views for describing an article manufacturing method.

Next, description regarding a detailed method of manufacturing an article is given. As illustrated in FIG. 9A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 9B:
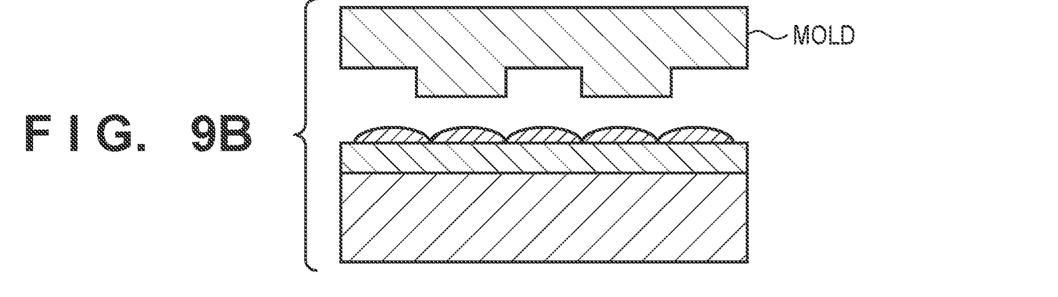
Figure 9C:
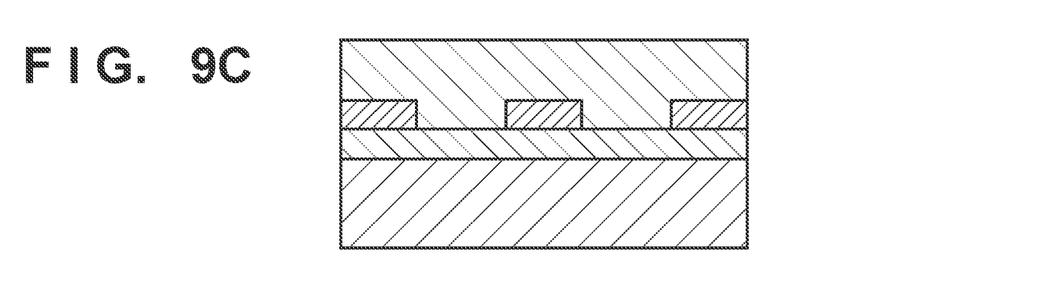

As shown in FIG. 9B, a side of the mold for imprint with a projection and groove pattern is formed on and caused to face the imprint material on the substrate. As illustrated in FIG. 9C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

Figure 9D:
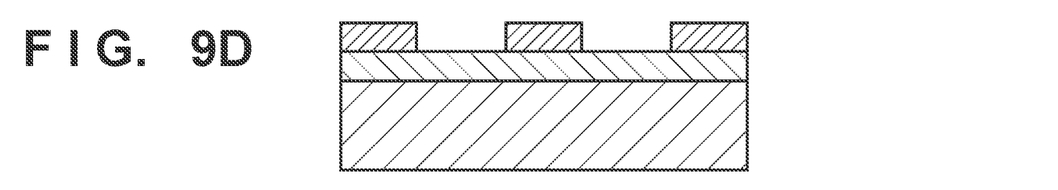

As shown in FIG. 9D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold is transferred to the imprint material.

Figure 9E:
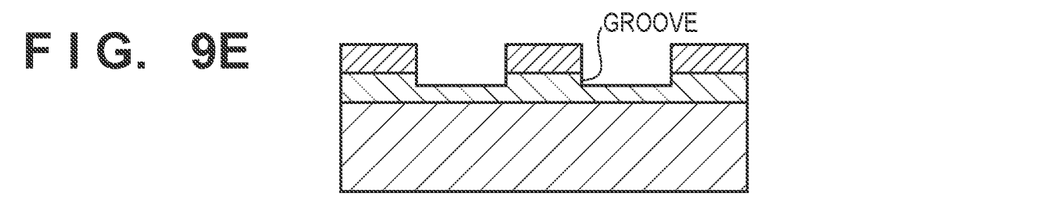
Figure 9F:
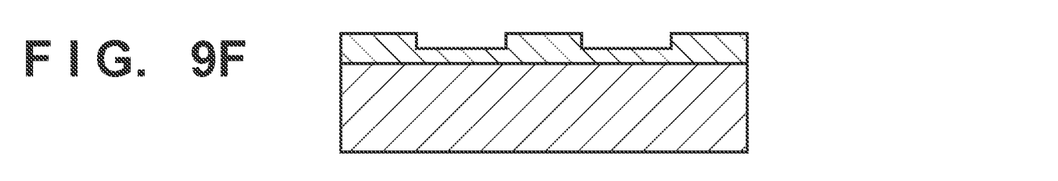

As shown in FIG. 9E, when etching is performed using the pattern of the cured product as an etching resistant mask, a portion of the surface of the processed material where the cured product does not exist or remains thin is removed to form a groove. As shown in FIG. 9F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2022-022305 filed on Feb. 16, 2022, which is hereby incorporated by reference herein in its entirety.

What is claimed is:

1. An imprint apparatus for performing an imprint process of forming a pattern of an imprint material on a substrate using a mold, the apparatus comprising:
   a measurement unit configured to measure a positional shift between the mold and the substrate; and
   a control unit configured to:
      control the imprint apparatus to bring the mold into contact with the imprint material on the substrate while deforming the mold into a convex shape toward a side of the substrate, and planarizing the mold in a state in which the mold and the imprint material are in contact with each other as a contact step;
      obtain data for estimating a fluctuation of the positional shift between the mold and the substrate, occurring during the contact step;
      obtain an estimation value by estimating the positional shift occurring during the contact step based at least on the positional shift measured by the measurement unit at a reference time during the contact step and the obtained data for estimating the fluctuation of the positional shift;
      control the imprint apparatus to drive at least one of the mold and the substrate in the contact step based on the obtained estimation value to reduce the positional shift between the mold and the substrate prior to performing an alignment step of aligning the mold and the substrate; and
      control the imprint apparatus to perform the alignment step to further correct any remaining positional shift between the mold and the substrate after reducing the positional shift between the mold and the substrate based on the estimation value,
   wherein, before performing the imprint process on the substrate, the control unit is configured to perform a prior contact step of bringing the mold into contact with the imprint material on a test substrate different from the substrate while deforming the mold into the convex shape toward a side of the test substrate, and planarizing the mold in a state in which the mold and the imprint material are in contact with each other, and acquire, as the data, a fluctuation of a positional shift between the mold and the test substrate occurring during the prior contact step.

2. The apparatus according to claim 1, wherein
the contact step includes a first contact step of bring the mold into contact with the imprint material on the substrate while deforming the mold into the convex shape toward the side of the substrate, and a second contact step of planarizing the mold in the state in which the mold and the imprint material are in contact with each other, and
the reference time is a start time of starting the second contact step.

3. The apparatus according to claim 2, wherein
the data indicates a difference between the positional shift between the mold and the test substrate at a start time of starting a second prior contact step, which is included in the prior contact step for the test substrate and corresponds to the second contact step, and the positional shift between the mold and the test substrate at an end time of ending the second prior contact step corresponding to the second contact step.

4. The apparatus according to claim 3, further comprising a driving unit configured to relatively drive the mold and the substrate,
wherein the control unit is configured to estimate, as the estimation value, the positional shift at an end time of the second contact step based at least on the positional shift measured by the measurement unit at the start time of the second contact step and the obtained data for estimating the fluctuation of the positional shift, and provide the driving unit a command value for driving at least one of the mold and the substrate so as to reduce the estimated positional shift at the end time of the second contact step.

5. The apparatus according to claim 2, wherein
the obtained data for estimating the fluctuation of the positional shift indicates, in time series, the positional shifts between the mold and the test substrate at respective times during a second prior contact step which is included in the prior contact step for the test substrate and corresponds to the second contact step.

6. The apparatus according to claim 5, further comprising a driving unit configured to relatively drive the mold and the substrate,
wherein the control unit is configured to estimate, as the estimation value, the positional shifts at respective times during the second contact step based at least on the positional shift measured by the measurement unit at the start time of the second contact step and the obtained data for estimating the fluctuation of the positional shift, and provide the driving unit a command value for driving at least one of the mold and the substrate so as to reduce the estimated positional shifts at the respective times during the second contact step.

7. The apparatus according to claim 1, wherein each of the substrate and the test substrate includes a plurality of shot regions that are arrayed in a same layout.

8. The apparatus according to claim 7, wherein the control unit is configured to acquire the data for each of the plurality of shot regions.

9. The apparatus according to claim 1, wherein the test substrate is a first substrate of a lot including the substrate.

10. The apparatus according to claim 1, wherein the substrate includes a plurality of shot regions, and the control unit is configured to acquire, as the data, the fluctuation of the positional shift between the mold and the substrate occurring during the contact step, which is acquired as a result of performing the contact step on a first shot region having undergone the imprint process prior to a second shot region to undergo the imprint process among the plurality of shot regions.

11. An imprint method for performing an imprint process of forming a pattern of an imprint material on a substrate using a mold, the imprint method comprising:
a first control step of controlling the imprint apparatus to bring the mold into contact with the imprint material on the substrate while deforming the mold into a convex shape toward a side of the substrate, and planarizing the mold in a state in which the mold and the imprint material are in contact with each other as a contact step;
a data acquisition step of acquiring data for estimating the positional shift between the mold and the substrate, occurring during the contact step;
an estimation step of obtaining an estimation value by estimating the positional shift occurring during the contact step based at least on the positional shift measured by the measurement unit at a reference time during the contact step and the obtained data for estimating the fluctuation of the positional shift;
a second control step of controlling the imprint apparatus to drive at least one of the mold and the substrate based on the obtained estimation value to reduce the positional shift between the mold and the substrate prior to performing an alignment step of aligning the mold and the substrate; and
a third control step of controlling the imprint apparatus to perform the alignment step to further correct any remaining positional shift between the mold and the substrate after reducing the positional shift between the mold and the substrate based on the estimation value,
wherein, before performing the first control step, the method further includes performing a prior contact step of bringing the mold into contact with the imprint material on a test substrate different from the substrate while deforming the mold into the convex shape toward a side of the test substrate, and planarizing the mold in a state in which the mold and the imprint material are in contact with each other, and acquire, as the data, a fluctuation of a positional shift between the mold and the test substrate occurring during the prior contact step.

12. An article manufacturing method comprising:
forming a pattern on a substrate using an imprint method defined in claim 11;
processing the substrate on which the pattern is formed in the forming; and
manufacturing an article from the processed substrate.

* * * * *